(12) United States Patent
Shimoyama et al.

(10) Patent No.: US 6,791,818 B1
(45) Date of Patent: Sep. 14, 2004

(54) ELECTRONIC DEVICE

(75) Inventors: Koji Shimoyama, Hyogo (JP);
Yoshihisa Takase, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/450,477

(22) PCT Filed: Oct. 2, 2002

(86) PCT No.: PCT/JP02/10260
§ 371 (c)(1),
(2), (4) Date: Jun. 12, 2003

(87) PCT Pub. No.: WO03/032697
PCT Pub. Date: Apr. 17, 2003

(30) Foreign Application Priority Data

Oct. 2, 2001 (JP) ........................................ 2001-306131

(51) Int. Cl.[7] .................................................. H01G 4/35
(52) U.S. Cl. ...................... 361/302; 361/303; 361/305; 361/321.1; 361/321.5; 361/306; 361/311; 361/313; 174/250
(58) Field of Search ................................. 361/302, 305, 361/306.1, 306.3, 321.1, 321.5, 329, 330, 311, 313; 438/253, 254, 393; 174/250, 253, 254, 256, 261, 262

(56) References Cited

U.S. PATENT DOCUMENTS

| 4,626,479 A | * | 12/1986 | Hosoi et al. ................. 428/663 |
| 4,786,564 A | * | 11/1988 | Chen et al. ............. 428/694 TS |
| 6,362,950 B1 | * | 3/2002 | Kamigawa et al. ......... 361/523 |

FOREIGN PATENT DOCUMENTS

| JP | 07-211133 A | 8/1995 |
| JP | 10-135607 A | 5/1998 |
| JP | 10-256708 A | 9/1998 |
| JP | 2000-160348 A | 6/2000 |

OTHER PUBLICATIONS

Japanese International Search Report for PCT/JP02/10260, dated Jan. 21, 2003.

* cited by examiner

*Primary Examiner*—Dean A. Reichard
*Assistant Examiner*—Nguyen T. Ha
(74) *Attorney, Agent, or Firm*—RatnerPrestia (57) ABSTRACT

An electrode of an electronic device includes plural nickel layers adjacent to each other, and an outer nickel layer contains less phosphorus than an inner nickel layer. The electrode has an increased solder joining strength without having a flexural strength decreased.

7 Claims, 5 Drawing Sheets

| Embodiment | 1 | 2 | 3 | 4 | 5 | 6 | Comparative Example | | |
|---|---|---|---|---|---|---|---|---|---|
| | | | | | | | 1 | 2 | 3 |
| Phosphorous Content of Ni Layer on Layer (wt%) | / | / | / | / | 3 | 0 | | | |
| Phosphorous Content of Ni Layer 12 (wt%) | 6 | 5 | 3 | 0 | 7 | 7 | 10 | 8 | 6 |
| Phosphorous Content of Ni Layer 12 (wt%) | 7 | 7 | 7 | 7 | 10 | 10 | | | |
| Joining Strength (N) | 17 | 17 | 17 | 19 | 17 | 19 | 3 | 4 | 10 |
| Flexural Strength (Times) | 100 | 100 | 100 | 100 | 110 | 110 | 110 | 100 | 80 |

Fig. 12

| Embodiment | 7 | 8 | 9 | 10 | 11 | 12 | 13 | 14 |
|---|---|---|---|---|---|---|---|---|
| Outermost Layer | Gold | Tin | Gold | Tin | Gold | Tin | Gold | Tin |
| Phosphorous Content of Ni Layer on Layer (wt%) | / | / | / | / | 3 | 3 | 0 | 0 |
| Phosphorous Content of Ni Layer 12 (wt%) | 5 | 5 | 0 | 0 | 7 | 7 | 7 | 7 |
| Phosphorous Content of Ni Layer 12 (wt%) | 7 | 7 | 7 | 7 | 10 | 10 | 10 | 10 |
| Joining Strength (N) | 21 | 21 | 21 | 21 | 21 | 21 | 12 | 21 |
| Flexural Strength | 100 | 100 | 100 | 100 | 110 | 110 | 110 | 110 |

ELECTRONIC DEVICE

THIS APPLICATION IS A U.S. NATIONAL PHASE APPLICATION OF PCT INTERNATIONAL APPLICATION PCT/JP02/10260.

TECHNICAL FIELD

The present invention relates to an electronic device including an electrode.

BACKGROUND ART

A base of an electrode of an electronic device is generally made of copper since copper is highly conductive and inexpensive. For improving joining of the base to another electronic device, a gold layer, a solder layer, or a tin layer is generally formed on the base. If the gold layer, for example, is formed directly on the copper base, the gold layer changes into an alloy layer composed of copper and gold due to mutual diffusion of gold atoms and copper atoms. The alloy layer causes joining failure in the joining of the electronic device to another device.

For preventing the formation of the alloy layer and the joining failure, a nickel layer is formed between the copper base and the gold layer. The nickel layer is often formed by electroless plating recently since an electrode is small and complicated. Nickel plating solution used for the electroless plating generally contains nickel sulfate and hypophosphorous acid compound as reducer. Nickel is deposited by oxidation-reduction reaction of the nickel sulfate and hypophosphorous acid compound, thereby forming the nickel layer.

However, the oxidation-reduction reaction starts when two components are mixed, and thus, an amount of nickel that does not contributes to the forming of the nickel layer is deposited in the plating solution, thus shortening a life time of the plating solution.

For preventing this problem, a stabilizer for disturbing the oxidation-reduction reaction is added to the plating solution. Catalyst, such as palladium, is applied on the electrode as a pre-treatment before the plating, and then, the electrode is dipped into the plating solution. Thus, the catalyst allows the oxidation-reduction reaction to start, and then, a nickel layer is formed on the electrode.

At this moment, a reduction reaction of hypophosphorous acid, a reducer, occurs as a secondary reaction, and phosphorus produced is taken into the nickel layer. The nickel layer therefore contains the phosphorous.

When the device is soldered on the electrode with tin alloy solder, nickel atoms in the nickel layer diffuse into a solder layer due to heat in the soldering, and therefore, a layer containing relatively-much phosphorus (it is hereinafter called a concentrated-phosphorus layer) is produced at an interface between the nickel layer and the solder layer. The more phosphorus is contained in the nickel layer, the more a metal lattice of nickel metal deforms. As a result, the rate of amorphous material in the nickel layer increases, and property of the nickel metal is tend to decline.

The tendency increases flexural strength of the electrode, but decreases the joining strength between the concentrated-phosphorus layer and the solder layer.

DISCLOSURE OF THE INVENTION

A device includes an electrode including a base, a first layer located over the base made mainly of nickel, and a second layer located on the first layer. The second layer is made mainly of nickel having a phosphorus concentration less than a phosphorus concentration of the first layer.

The electrode has an increased joining strength without having a flexural strength decreased.

DETAILED DESCRIPTION OF PREFERRED EMBODIMENTS

Embodiment 1

Figure 1:
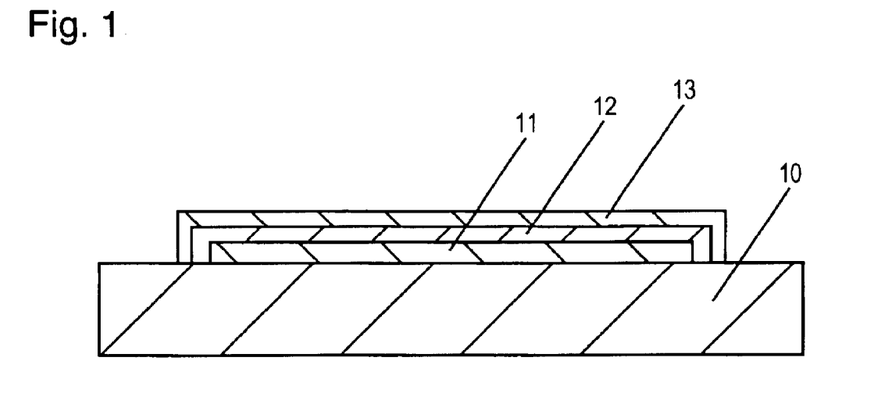
FIG. 1 is a sectional view of an electrode of an electronic device in accordance with exemplary embodiments 1 to 4 of the present invention.

FIG. 1 is a sectional view of an electrode on a printed wiring board in accordance with exemplary embodiment 1 of the present invention. The printed wiring board includes a substrate 10 made of glass epoxy resin and a copper electrode 11 located on the substrate 10. The copper electrode 11 is made of copper foil as a base of the electrode. A nickel layer 12 containing 7% of phosphorus is formed on the copper electrode 11, and a nickel layer 13 containing 6% of phosphorus is formed on the nickel layer 12. For example, the printed wiring board has a 0.6 mm thickness. The nickel layer 12 containing 7 wt % of phosphorus and having a 4 μm thickness is formed on the copper electrode 11, i.e. the copper foil, having a 18 μm thickness, and the nickel layer 13 containing 6 wt % of phosphorus having a 1 μm thickness is formed on the nickel layer 12.

A method of manufacturing the copper electrode will be described.

First, the copper electrode 11 on the printed wiring board is degreased, is washed with purified water, and is etched in sequence, thereby removing oxide and soil from the surface of the copper electrode 11. The copper electrode is washed with purified water again.

The copper electrode 11 is dipped into palladium solution, and palladium having catalysis is adsorbed onto the surface of the copper electrode 11.

The copper electrode 11 is then dipped into nickel plating solution containing 7 wt % of phosphorus, thus having the 4 μm-thick nickel layer 12 containing 7 wt % of phosphorus formed on the copper electrode 11 on the printed wiring board. The electrode is then dipped into nickel plating solution containing 6 wt % of phosphorus, thus having the 1 μm-thick nickel layer 13 containing 6 wt % of phosphorus is formed on the nickel layer 12. Then, the electrode is washed with purified water and is then dried.

Thickness of each of nickel layers 12 and 13 is measured with fluorescent X-ray.

Embodiment 2

FIG. 1 is a sectional view of an electrode on a printed wiring board in accordance with exemplary embodiment 2 of the present invention.

By a method similar to that of embodiment 1, a nickel layer 12 containing 7 wt % of phosphorus and having a 4 μm thickness is formed on a copper electrode 11 on the printed wiring board. The electrode is then dipped into nickel plating solution containing 5 wt % of phosphorus, thereby forming a nickel layer 13 containing 5 wt % of phosphorus and having a 1 μm thickness on the nickel layer 12.

Embodiment 3

FIG. 1 is a sectional view of an electrode on a printed wiring board in accordance with exemplary embodiment 3 of the present invention.

By a method similar to that of exemplary embodiment 1, a nickel layer 12 containing 7 wt % of phosphorus and having 4 μm thickness is formed on a copper electrode 11 on the printed wiring board. The electrode is then dipped into nickel plating solution containing 3 wt % of phosphorus, thereby forming a nickel layer 13 containing 3 wt % of phosphorus and having a 1 μm thickness on the nickel layer 12.

Embodiment 4

FIG. 1 is a sectional view of an electrode on a printed wiring board in accordance with exemplary embodiment 4 of the present invention.

By a method similar to that of exemplary embodiment 1, a nickel layer 12 containing 7 wt % of phosphorus having a 4 μm thickness is formed on a copper electrode 11 on the printed wiring board. The electrode is then dipped into nickel plating solution containing no phosphorus, thereby forming a nickel layer 13 containing no phosphorus and having a 1 μm thickness on the nickel layer 12.

The nickel plating solution used for forming the nickel layer 13 containing no phosphorus contains not hypophosphorous acid but sodium borohydride as reducer.

Embodiment 5

Figure 9:
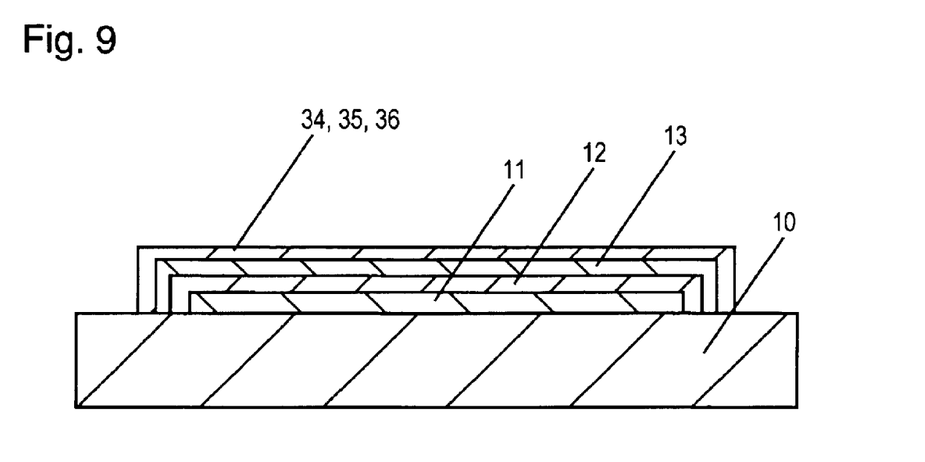
FIG. 9 is a sectional view of an electrode in accordance with exemplary embodiments 5 to 10 of the invention.

FIG. 9 is a sectional view of an electrode on a printed wiring board in accordance with exemplary embodiment 5 of the present invention.

Three nickel layers are formed over the electrode of the embodiment 5.

First, similarly to embodiment 1, palladium is adsorbed onto a surface of a copper electrode 11 on the printed wiring board.

The electrode is then dipped into nickel plating solution containing 10 wt % of phosphorus, thereby forming a nickel layer 12 containing 10 wt % of phosphorus and having 3 μm thickness on the copper electrode 11 on the printed wiring board. The electrode is then dipped into nickel plating solution containing 7 wt % of phosphorus, thereby forming a nickel layer 13 containing 7 wt % of phosphorus and having a 1 μm thickness on the nickel layer 12. The electrode is then dipped into nickel plating solution containing 3 wt % of phosphorus to form a nickel layer 36 containing 3 wt % of phosphorus and having a 1 μm thickness on the nickel layer 13, as shown in FIG. 9. The electrode is washed with purified water and is then dried.

Embodiment 6

FIG. 9 is a sectional view of an electrode on a printed wiring board in accordance with exemplary embodiment 6 of the present invention.

Three nickel layers are formed over the electrode of embodiment 6.

Similarly to embodiment 5, a nickel layer 12 containing 10 wt % of phosphorus and having a 3 μm thickness is formed on a copper electrode 11 on the printed wiring board. A nickel layer 13 containing 7 wt % of phosphorus and having a 1 μm thickness is formed on the nickel layer 12. Then, similarly to embodiment 4, the electrode is then dipped into nickel plating solution containing no phosphorus, thereby forming a nickel layer 36 containing no phosphorus and having a 1 μm thickness on the nickel layer 13.

Embodiment 7

FIG. 9 is a sectional view of an electrode on a printed wiring board in accordance with exemplary embodiment 7 of the present invention.

Similarly to embodiment 2, a nickel layer 12 containing 7 wt % of phosphorus and having a 4 μm thickness is formed on a copper electrode 11 on the printed wiring board, and a nickel layer 13 containing 5 wt % of phosphorus and having a 1 μm thickness is formed on the nickel layer 12.

A gold layer 34 having a 0.05 μm thickness is then formed on the nickel layer 13 by gold plating with gold cyanide plating solution.

Embodiment 8

FIG. 9 is a sectional view of an electrode on a printed wiring board in accordance with exemplary embodiment 8 of the present invention.

Similarly to embodiment 2, a nickel layer 12 containing 7 wt % of phosphorus and having a 4 μm thickness is formed on a copper electrode 11 on the printed wiring board, and a nickel layer 13 containing 5 wt % of phosphorus and having a 1 μm thickness is formed on the nickel layer 12.

A tin layer 35 having a 0.05 μm thickness is then formed on the nickel layer 13 by plating with stannous sulfate plating solution.

Embodiment 9

FIG. 9 is a sectional view of an electrode on a printed wiring board in accordance with exemplary embodiment 9 of the present invention.

Similarly to embodiment 4, a nickel layer 12 containing 7 wt % of phosphorus and having a 4 μm thickness is formed on a copper electrode 11 on the printed wiring board, and a nickel layer 13 containing no phosphorus and having a 1 μm thickness is formed on the nickel layer 12.

A gold layer 34 having a 0.05 μm thickness is then formed on the nickel layer 13 similarly to embodiment 7.

Embodiment 10

FIG. 9 is a sectional view of an electrode on a printed wiring board in accordance with exemplary embodiment 10 of the present invention.

Similarly to embodiment 4, a nickel layer 12 containing 7 wt % of phosphorus and having a 4 μm thickness is formed on a copper electrode 11 on the printed wiring board, and a nickel layer 13 containing no phosphorus and having a 1 μm thickness is formed on the nickel layer 12.

A tin layer 35 having a 0.05 μm thickness is then formed on the nickel layer 13 similarly to embodiment 8.

Embodiment 11

Figure 10:
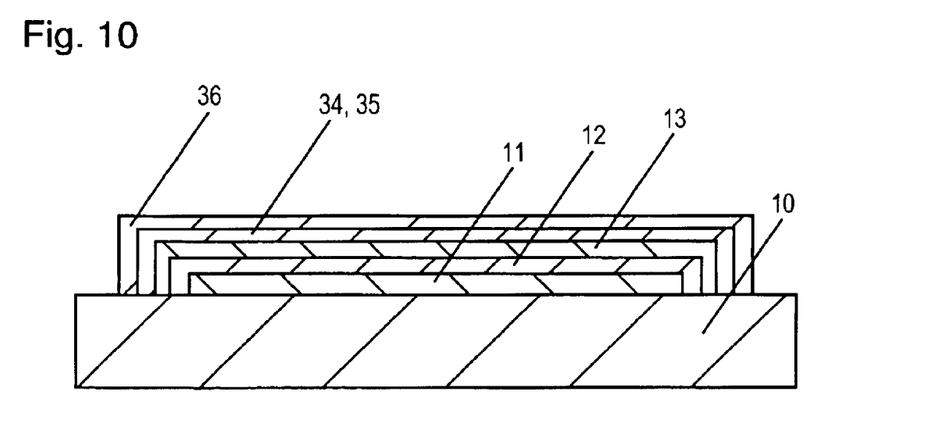
FIG. 10 is a sectional view of an electrode in accordance with exemplary embodiments 11 to 14 of the invention.

FIG. 10 is a sectional view of an electrode on a printed wiring board in accordance with exemplary embodiment 11 of the present invention.

Three nickel layers are formed over the electrode of exemplary embodiment 11.

Similarly to embodiment 5, a nickel layer 12 containing 10 wt % of phosphorus and having 3 μm thickness is formed on a copper electrode 11 on the printed wiring board, and a nickel layer 13 containing 7 wt % of phosphorus having a 1 μm thickness is formed on the nickel layer 12.

Then, as shown in FIG. 10, a nickel layer 36 containing 3 wt % of phosphorus and having a 1 μm thickness is formed on the nickel layer 13, and a gold layer 34 having a 0.05 μm thickness is then formed on the outermost nickel layer similarly to embodiment 7.

Embodiment 12

FIG. 10 is a sectional view of an electrode on a printed wiring board in accordance with exemplary embodiment 12 of the present invention.

Three nickel layers are formed over the electrode of embodiment 12.

Similarly to embodiment 5, a nickel layer 12 containing 10 wt % of phosphorus and having a 3 μm thickness is formed on a copper electrode 11 on the printed wiring board, and a nickel layer 13 containing 7 wt % of phosphorus and having a 1 μm thickness is formed on the nickel layer 12.

Then, as shown in FIG. 10, a nickel layer 36 containing 3 wt % of phosphorus having a 1 μm thickness is formed on the nickel layer 13, and a tin layer 35 having a 0.05 μm thickness is then formed on the outermost nickel layer similarly to embodiment 8.

Embodiment 13

FIG. 10 is a sectional view of an electrode on a printed wiring board in accordance with exemplary embodiment 13 of the present invention.

Three nickel layers are formed over the electrode of embodiment 13.

Similarly to embodiment 6, a nickel layer 12 containing 10 wt % of phosphorus and having a 3 μm thickness is formed on a copper electrode 11 on the printed wiring board, and a nickel layer 13 containing 7 wt % of phosphorus and having a 1 μm thickness is formed on the nickel layer 12.

Then, as shown in FIG. 10, a nickel layer 36 containing no phosphorus and having a 1 μm thickness is formed on the nickel layer 13, and a gold layer 34 having a 0.05 μm thickness is then formed on the outermost nickel layer similarly to embodiment 7.

Embodiment 14

FIG. 10 is a sectional view of an electrode on a printed wiring board in accordance with embodiment 14 of the present invention.

Three nickel layers are formed over the electrode of embodiment 14.

Similarly to embodiment 6, a nickel layer 12 containing 10 wt % of phosphorus and having a 3 μm thickness is formed on a copper electrode 11 on the printed wiring board, and a nickel layer 13 containing 7 wt % of phosphorus and having a 1 μm thickness is formed on the nickel layer 12.

Then, as shown in FIG. 10, a nickel layer 36 containing no phosphorus and having a 1 μm thickness is formed on the nickel layer 13, and a tin layer 35 having a 0.05 μm thickness is then formed on the outermost nickel layer similarly to embodiment 8.

COMPARATIVE EXAMPLE 1

A copper electrode 11 on a printed wiring board is degreased, washed with purified water, etched, and washed with purified water again similarly to the embodiments of the invention. The electrode is then dipped into nickel plating solution containing 10 wt % of phosphorus, thereby forming a nickel layer 12 containing 10 wt % of phosphorus and having a 5 μm thickness on the copper electrode 11.

COMPARATIVE EXAMPLE 2

A method of comparative example 2 is similar to that of comparative example 1 except that nickel plating solution containing 8 wt % of phosphorus is used. By this method, a nickel layer 12 containing 8 wt % of phosphorus and having a 5 μm thickness is formed on a copper electrode 11 on a printed wiring board.

COMPARATIVE EXAMPLE 3

A method of comparative example 3 is similar to that of the comparative example 1 except that nickel plating solution containing 6 wt % of phosphorus is used. By this method, a nickel layer 12 containing 6 wt % of phosphorus and having a 5 μm thickness is formed on a copper electrode 11 on a printed wiring board.

The electrodes formed according to embodiments 1 to 14 of the present invention and comparative examples 1 to 3 are left for 24 hours in the atmosphere at 25° C., and then, solder joining strength and flexural strength are measured.

A method of measuring solder joining strength will be described with reference to FIG. 5 to FIG. 8.

Figure 5:
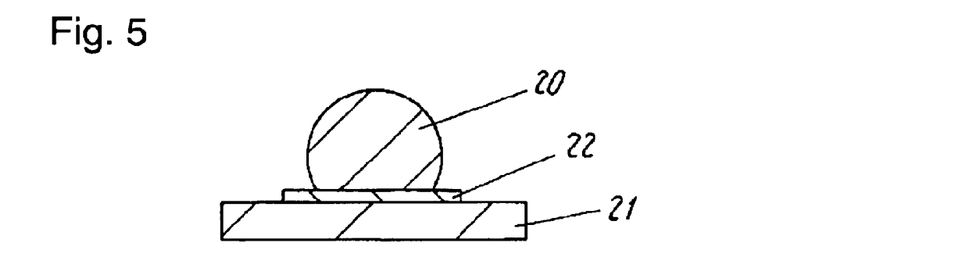
FIG. 5 is a sectional view of the electrode shown in FIG. 1 having a solder ball connected thereto.

In FIG. 5, a connecting pad 22 having a diameter of 0.5 mm is formed on a printed wiring board 21 of each of the embodiments 1 to 14 and comparative examples 1 to 3. The pad 22 is a laminated body including a copper electrode 11 and nickel layers 12 and 13 shown in FIG. 1. A solder ball 20 having a diameter of 0.75 mm is connected to the pad 22 by performing reflow for 30sec. at 230° C. three times.

Figure 6:
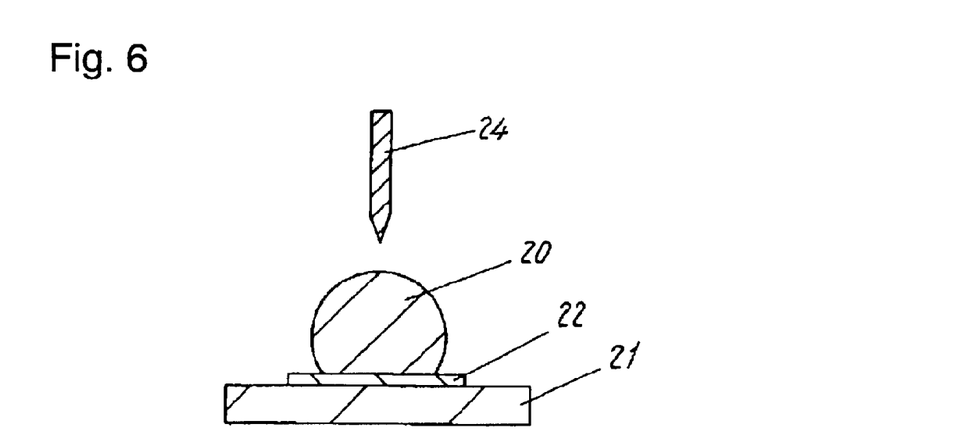
FIG. 6 is a sectional view of the electrode shown in FIG. 5a having a heating probe approached thereto.

In FIG. 6, the printed wiring board 21 is fixed to a stage, flux is applied onto the solder ball 20, and a heating probe 24 approaches from just above part toward the center of the solder ball 20.

Figure 7:
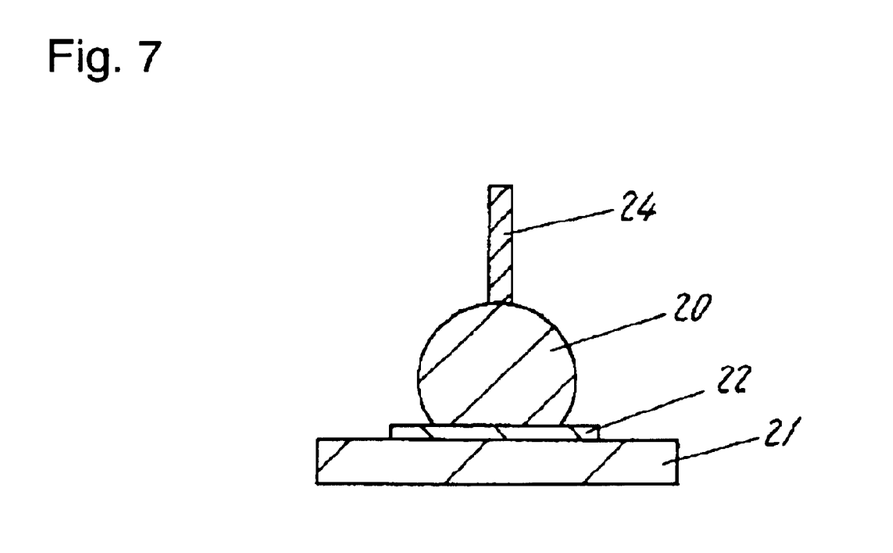
FIG. 7 is a sectional view of the electrode shown in FIG. 6 having a heating probe contacting the ball on the electrode.

In FIG. 7, the tip of the heating probe 24 is inserted into the solder ball by 0.2 mm, and the heating probe 24 is cooled to be fixed in the solder ball 20.

Figure 8:
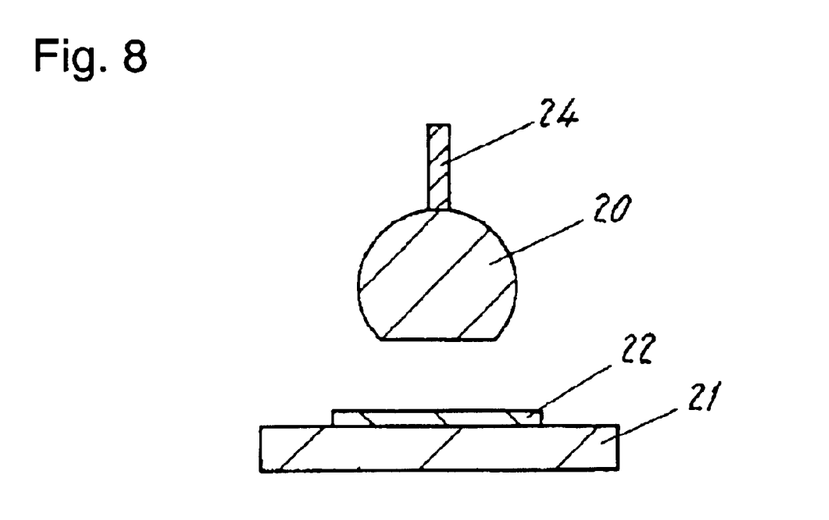
FIG. 8 is a sectional view of the electrode shown in FIG. 7 from the solder ball is removed.

In FIG. 8, the heating probe 24 is raised vertically at 300 μ/sec. to separate the solder ball 20 from the pad 22. A force necessary for this separation is measured, and the measured value is defined as the solder joining strength.

Next, a method of measuring a flexural strength will be described.

First, a wiring pattern of the laminated body including the copper electrode 11 and nickel layers 12 and 13 shown in FIG. 1 is formed on the printed wiring board 21. Forces are applied to both longitudinal ends of the board 21, thereby displacing a center of the board 21 upward by 3 cm and downward by 3 cm with reference to a normal position of the center. The number of times of the displacing is measured until the wiring pattern on the printed wiring board 21 is broken.

Figure 11:
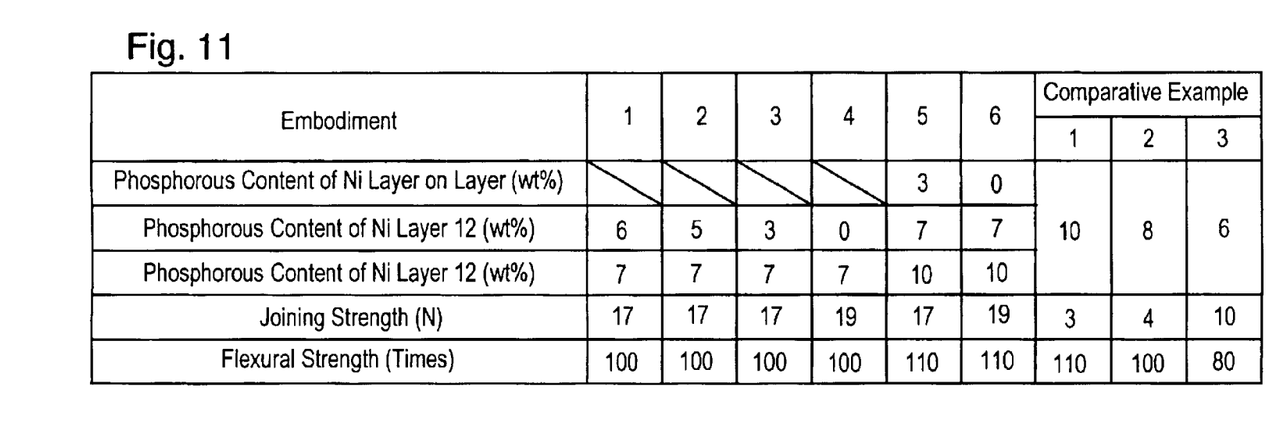
FIG. 11 shows solder joining strength and flexural strength of the electrode of exemplary embodiments 1 to 6.
Figure 12:
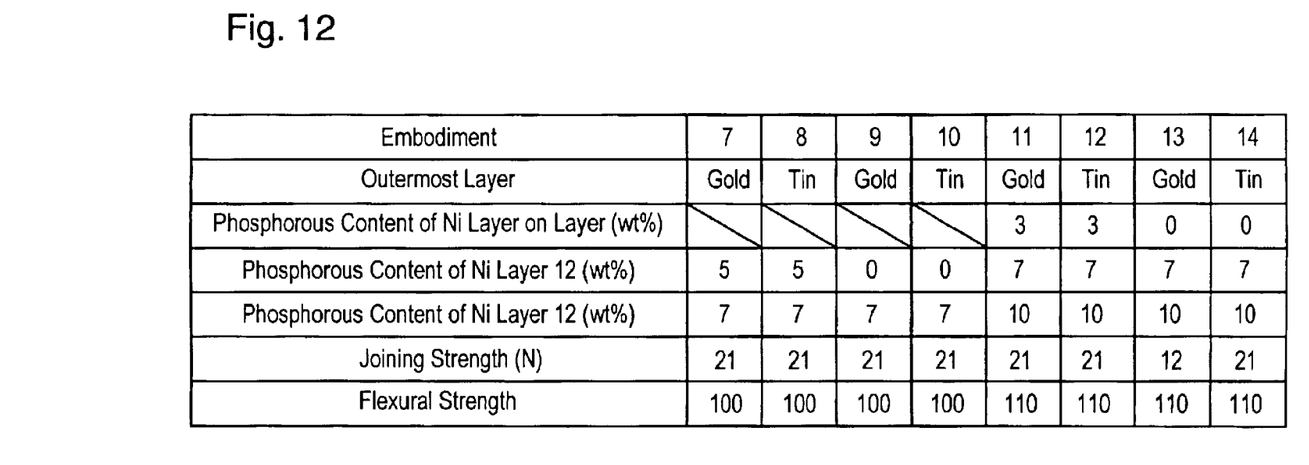
FIG. 12 shows solder joining strength and flexural strength of the electrode of exemplary embodiments 7 to 14.

FIG. 11 and FIG. 12 show the solder joining strength and the number of the displacing until the breaking of the electrode of each of the embodiments 1 to 14 of the invention and comparative examples 1 to 3. Each value is an average of 10 electrodes.

As shown in the tables of FIG. 11 and FIG. 12, the printed wiring boards 21 having the electrodes of the embodiments 1 to 14 have larger flexural strength and larger solder joining strength than the boards having the electrodes of the comparative examples 1 to 3.

The obtained results are considered as below.

The more the nickel layer contains phosphorus, the more the ratio of amorphous material formed by bonding the nickel and phosphorus become in the interface between the solder ball 20 and the outermost nickel layer, while the nickel layer containing no phosphorus is a metal layer. Therefore, the amorphous ratio in the nickel layer increases.

When a solder layer is formed on the nickel layer, a heating for forming the solder layer causes nickel atoms in the nickel layer to diffuse into the solder layer. A concentrated-phosphorus layer is therefore formed in the interface between the nickel layer and the solder layer.

This concentrated-phosphorus layer has high amorphous ratio, thus decreasing the joining strength to the solder layer.

Therefore, a nickel layer containing less phosphorus is formed as the outermost layer, thereby decreasing the amorphous ratio in the concentrated-phosphorus layer. This results in an increase of the joining strength to the solder layer.

The concentration of phosphorus in the inner nickel layer is higher than that of the outer nickel layer. Therefore, the amorphous ratio in the inner nickel layer is higher than that of the outer nickel layer. As a result, the electrodes of the embodiments have flexural strength equivalent to that of the comparative examples.

A reason why the solder joining strength of the electrode including nickel layer containing no phosphorus as the outermost layer is that production of the concentrated-phosphorus layer in the outermost layer is suppressed, and the nickel layer is joined to the solder layer by metallic bond.

Further, the outermost layer of metal or phosphorus increases the solder joining strength. The reason for this is considered as follows. The nickel layer adjacent to the outermost layer of metal or phosphorus contains less phosphorus than the inner layer, or contains no phosphorus. While the outermost layer is formed by plating, the plating causes a substituting reaction between gold ions or phosphorus ions in the plating solution and nickel in the nickel layer. In other words, the nickel in the nickel layer is ionized in the gold plating solution or phosphorus plating solution, and gold or phosphorus, being nobler than nickel, is deposited at a place where nickel has been ionized to form the outermost layer.

When phosphorus is much contained in the nickel layer, gold ions or phosphorus ions are not substituted for the phosphorus, and therefore, the formed gold layer or phosphorus layer is more porous than a nickel layer containing less phosphorus or the outermost layer discussed above. This porous outermost layer facilitates infiltration of oxygen into the nickel layer, thus causing formation of oxide film and decreasing solder affinity.

In the electrode of each embodiment, however, the nickel layer adjacent to the outermost layer (i.e., the gold layer or phosphorus layer) contains less phosphorus than the innermost nickel layer, or contains no phosphorus. This allows a dense outermost layer to be formed, so that the infiltration of oxygen into the inner layer is suppressed, the solder affinity is improved, and the solder joining strength is increased.

Figure 2:
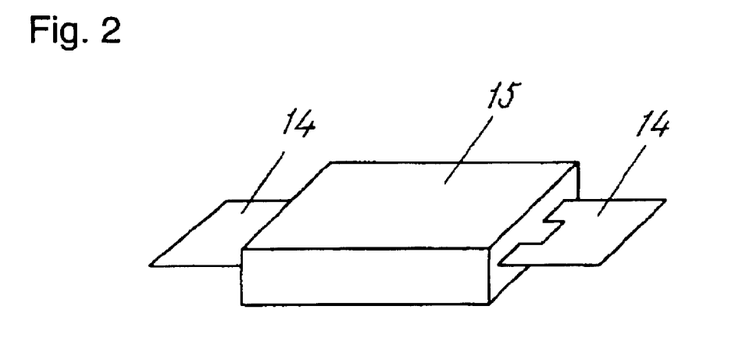
FIG. 2 is a perspective view of another electronic device in accordance with the exemplary embodiments.
Figure 3:
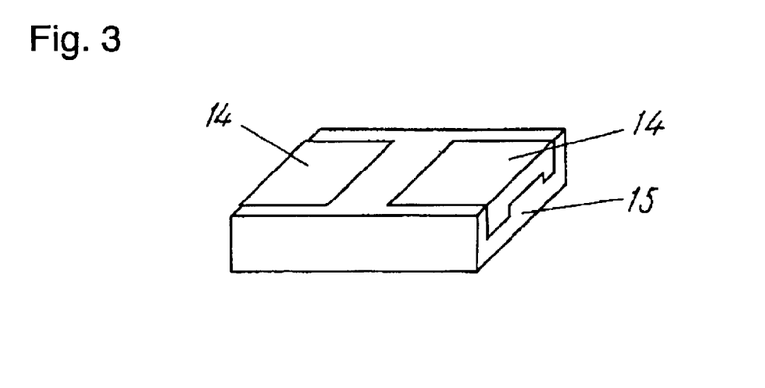
FIG. 3 is a perspective view of a further electronic device in accordance with the exemplary embodiments.
Figure 4:
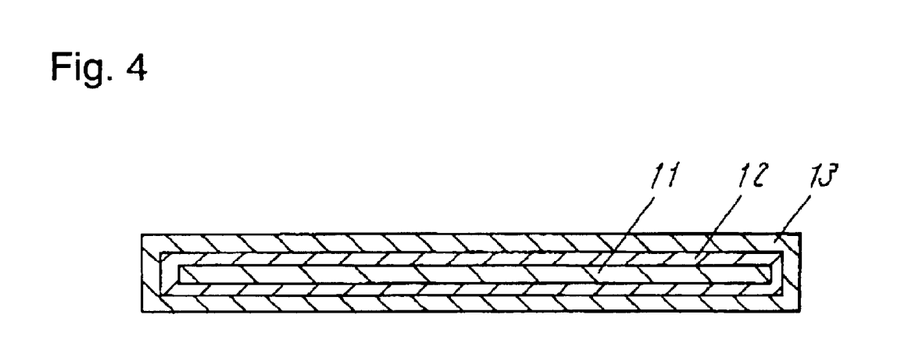
FIG. 4 is a sectional view of an electrode of still another electronic device in accordance with the exemplary embodiments.

FIG. 2 to FIG. 4 show a chip capacitor including the electrode of the embodiments. The chip capacitor includes a package 15 formed by resin molding and a projecting electrode 14, as shown in FIG. 3. The solder plating is applied to the electrode 14 which is not folded, as shown in FIG. 2, and then, the electrode 14 is folded, as shown in FIG. 3. In the electrode 14, as shown in FIG. 4, nickel layer 12 containing 7% of phosphorus is formed on the copper electrode 11 as a base, and the nickel layer 13 containing 6% of phosphorus formed on the nickel layer 12.

The copper electrode 11, the nickel layer 12, and the nickel layer 13 are formed according to embodiments 1 to 14 in considering a characteristic and quality of the electrode.

The electrode may includes another layer inside the nickel layer 12, namely between the substrate 11 and the nickel layer 12.

The printed wiring board or the chip capacitor as an electronic device is described in the embodiments of the present invention; however, the present invention is not limited to this and is applicable to a device including an electrode.

INDUSTRIAL APPLICABILITY

An electrode of an electronic device of the present invention has an increased solder joining strength without having a flexural strength decreased.

What is claimed is:

1. A wiring board comprising:
    a board; and
    an electrode including:
        a base made of metal on said board;
        a first layer located over said base, said first layer being made mainly of nickel and containing phosphorus; and
        a second layer located on said first layer, said second layer being made mainly of nickel having a phosphorus concentration less than a phosphorus concentration of said first layer.

2. The wiring board according to claim 1, wherein said second layer contains no phosphorus.

3. The wiring board according to claim 1, wherein said electrode further comprises a third layer located on said second layer and containing gold.

4. The wiring board according to claim 1, wherein said electrode further comprises a third layer located on said second layer and containing tin.

5. A device comprising:
    an electrode including:
        a base;
        a first layer located over said base, said first layer being made mainly of nickel and containing phosphorus; and
        a second layer located on said first layer, said second layer being made mainly of nickel and containing phosphorus, said second layer having a phosphorus concentration less than a phosphorus concentration of said first layer.

6. The device according to claim 5, wherein said electrode further comprises a third layer located on said second layer and containing gold.

7. The device according to claim 5, wherein said electrode further comprises a third layer located on said second layer and containing tin.

* * * * *